United States Patent
Han et al.

(10) Patent No.: US 8,736,537 B2
(45) Date of Patent: May 27, 2014

(54) SHIFT REGISTER, GATE DRIVING DEVICE AND DATA LINE DRIVING DEVICE FOR LIQUID CRYSTAL DISPLAY

(75) Inventors: Seung Woo Han, Beijing (CN); Guangliang Shang, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 114 days.

(21) Appl. No.: 13/380,994

(22) PCT Filed: Apr. 20, 2011

(86) PCT No.: PCT/CN2011/073079
§ 371 (c)(1),
(2), (4) Date: Dec. 27, 2011

(87) PCT Pub. No.: WO2011/131130
PCT Pub. Date: Oct. 27, 2011

(65) Prior Publication Data
US 2012/0113088 A1  May 10, 2012

(30) Foreign Application Priority Data

Apr. 20, 2011 (CN) .......................... 2010 1 0158961

(51) Int. Cl.
*G09G 3/36* (2006.01)
(52) U.S. Cl.
USPC .......................................................... 345/100
(58) Field of Classification Search
USPC ................ 345/98, 100, 204; 257/72
See application file for complete search history.

(56) References Cited

U.S. PATENT DOCUMENTS

| | | | |
|---|---|---|---|
| 7,872,628 B2 * | 1/2011 | Cho | 345/100 |
| 8,098,227 B2 * | 1/2012 | Lee et al. | 345/100 |
| 2002/0003964 A1 | 1/2002 | Kanbara et al. | |
| 2005/0134545 A1 * | 6/2005 | Jang et al. | 345/100 |
| 2007/0146289 A1 | 6/2007 | Lee et al. | |
| 2009/0251443 A1 | 10/2009 | Jinta | |

FOREIGN PATENT DOCUMENTS

| | | |
|---|---|---|
| CN | 1326178 A | 12/2001 |
| CN | 1941063 A | 4/2007 |
| CN | 101562048 A | 10/2009 |
| JP | 2010-086640 A | 4/2010 |
| KR | 20020004821 A | 1/2002 |
| KR | 20070035223 A | 3/2007 |

OTHER PUBLICATIONS

International Preliminary Report on Patentability dated Oct. 23, 2012; Appln. No. PCT/CN2011/073079.
International Search Report; mailed Aug. 4, 2011; PCT/CN2011/073079.
KIPO NOA dated Nov. 20, 2013, Appln. No. 10-2011-7030591.

* cited by examiner

*Primary Examiner* — Chanh Nguyen
*Assistant Examiner* — Roy Rabindranath
(74) *Attorney, Agent, or Firm* — Ladas & Parry LLP

(57) ABSTRACT

A shift register increases a number of thin film transistors for lowering drive and a manner of alternatively applying clock signals every other frame, lowers duty cycle of the thin film transistors for lowering drive, and effectively prevents a biasing effect by the thin film transistors for lowering drive, thereby reliability of the shift register unit is guaranteed.

8 Claims, 4 Drawing Sheets

SHIFT REGISTER, GATE DRIVING DEVICE AND DATA LINE DRIVING DEVICE FOR LIQUID CRYSTAL DISPLAY

TECHNICAL FIELD

The present invention relates to a shift register, a gate drive apparatus and a data line apparatus for a liquid crystal display (LCD).

BACKGROUND

A shift register unit in related arts includes a signal output terminal for outputting a driving signal. The shift register unit controls a row of thin film transistors (TFTs) to be turned on when the driving signal is at a high level and to be turned off when the driving signal is at a low level.

A LCD generally employs a way of progressive scanning, in which when a certain row or column is scanned, a corresponding shift register unit outputs a driving signal at a high level, and each of the other shift register units outputs a driving signal at a low level. It can be seen that, for one shift register unit, the driving signal thereof is at a low level for most of time.

During a period when the driving signal is at a low level, the driving signal is highly inclined to be influenced by an inputted clock signal, so that a noise may be generated. To suppress the noise, the shift register unit generally includes a lowering signal TFT for pulling down the driving signal during a period when the driving signal is at the low level. A junction node connected to the gate of the lowering signal TFT controls the lowering signal TFT to be turned on, thereby the level of the gate driving signal at the signal output terminal can be pulled down.

A problem existing in the shift register unit of the related art is that, the node connected to the gate of the lowering signal TFT is generally kept at a high level for most of time. and in this way, the lowering signal TFT remains conductive for most of time, which makes the threshold voltage of the lowering signal TFT generate a relatively large offset. If the threshold voltage of the lowering signal TFT is boosted constantly. it may cause the lowering signal TFT to fail to turn on and thereby to fail to serve to suppress the noise, thus performance of the shift register as a whole will be influenced.

SUMMARY

An embodiment of the present invention provides a shift register comprising at least two shift register units, one of which comprising: a boosting signal TFT for receiving a first clock signal, and outputting a high voltage signal to an output terminal in a conductive state thereof; a first boosting drive TFT for receiving a frame start signal or an output signal of another shift register unit so as to turn on the boosting signal TFT; a second boosting drive TFT for receiving a reset signal or an output signal of another shift register so as to turn on the boosting signal TFT; a first lowering signal TFT for receiving the reset signal or the output signal of the other shift register, and outputting a low voltage signal to the output terminal in conductive state thereof; a first lowering drive TFT for receiving a second clock signal so as to turn on a lowering signal TFT; a second lowering drive TFT for receiving a third clock signal so as to turn on the lowering signal TFT; a second lowering signal TFT for receiving the output signal of the first lowering drive TFT, and lowering the output signal of the output terminal in conductive state thereof; a third lowering signal TFT for receiving the output signal of the first lowering drive TFT, and lowering output signal of the output terminal in conductive state thereof; a first off-drive TFT for receiving the output signal of the first boosting drive TFT, and turning off the second lowering signal TFT and the third lowering signal TFT in conductive state thereof; a fourth lowering signal TFT for receiving the output signal of the second lowering drive TFT, and lowering the output signal of the output terminal in conductive state thereof; a fifth lowering signal TFT for receiving the output signal of the second lowering drive TFT, and lowering the output signal of the output terminal in conductive state thereof; and a second off-drive TFT for receiving the output signal of the first boosting drive TFT, and turning off the fourth lowering signal TFT and the fifth lowering signal TFT in conductive state thereof, and in the other shift register unit adjacent to said shift register unit, a boosting signal TFT, a first lowering drive TFT and a second lowering drive TFT receiving a fourth clock signal, a fifth clock signal and a sixth clock signal respectively.

Hereinafter, a further detailed description will be made to the present invention with specific embodiments and in connection with appended drawings. dr

BRIEF DESCRIPTION OF THE DRAWINGS

FIG. 1b shows a timing chart of input versus output of the shift register unit shown in FIG. 1a;

FIG. 2b shows a timing chart of input versus output of the other shift register unit shown in FIG. 2a.

DETAILED DESCRIPTION

In embodiments of the present invention, there is disclosed a shift register comprising at lease two shift register units.

Figure 1A:
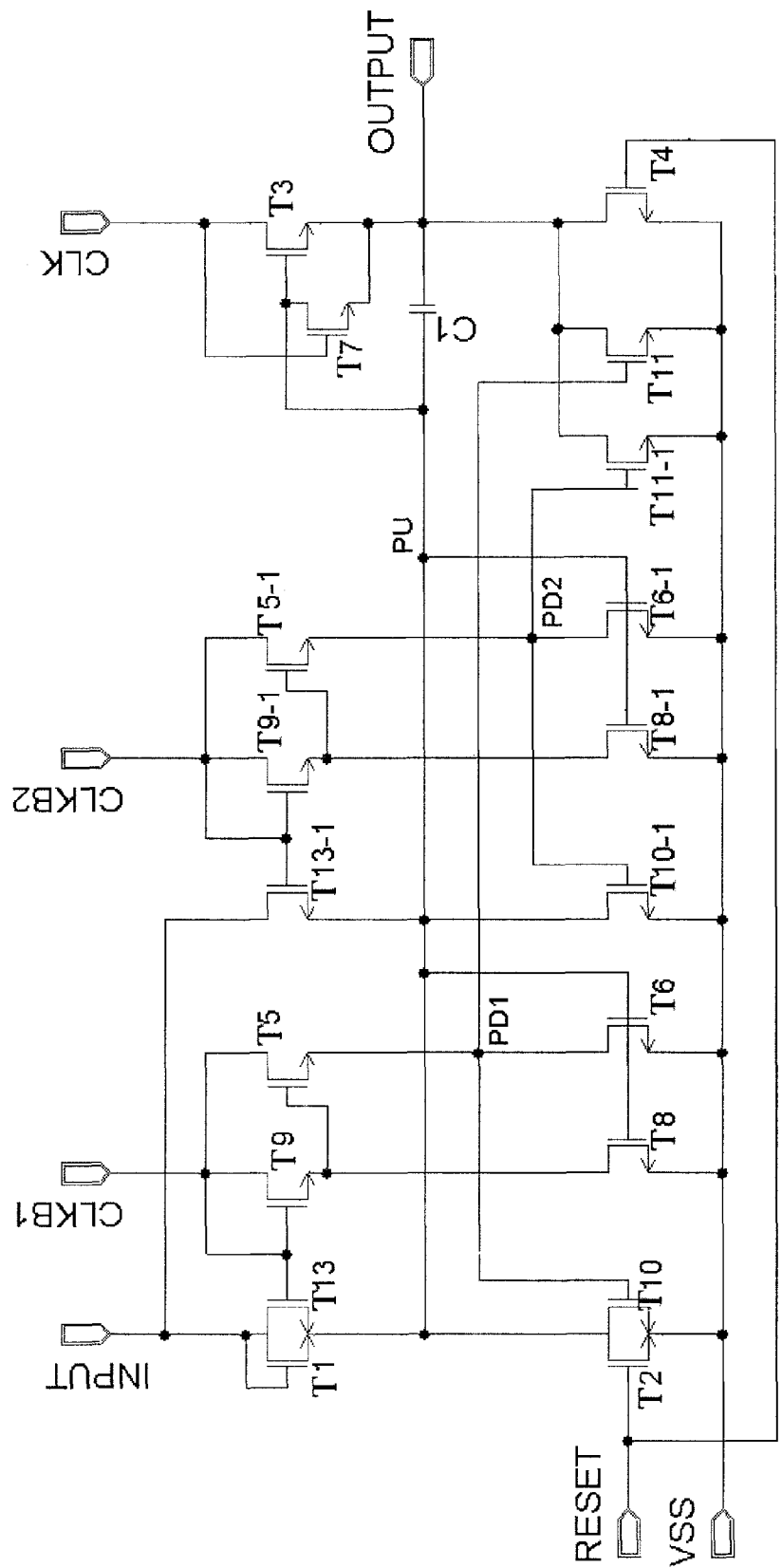
FIG. 1a shows a structure diagram for a shift register unit according to the invention.

As shown in FIG. 1a, in the shift registers according to an embodiment of the present invention, at least one shift register unit comprises a boosting signal TFT T3 for receiving a first clock signal CLK, and outputting a high voltage signal to an output terminal in a conductive state thereof; a first boosting drive TFT T1 for receiving a frame start signal or an output signal of the previous one shift register unit so as to turn on the boosting signal TFT T3; a second boosting drive TFT T2 for receiving an output signal of the next one shift register so as to turn on the boosting signal TFT T3; a first lowering signal TFT T4 for receiving the output signal of the next one shift register, and outputting a low voltage signal to the output terminal in the conductive state thereof; a first lowering drive TFT T5 for receiving a second clock signal CLKB1 so as to turn on a second lowering signal TFT T10 and a third lowering signal TFT T11; a second lowering drive TFT T5-1 for receiving a third clock signal CLKB2 so as to turn on a fourth lowering signal TFT T10-1 and a fifth lowering signal TFT T11-1; a second lowering signal TFT T10 for receiving an output signal of the first lowering drive TFT T5, and lowering the output signal of the output terminal in conductive state thereof; a third lowering signal TFT T11 for receiving the output signal of the first lowering drive TFT T5, and lowering the output signal of the output terminal in conductive state thereof; the fourth lowering signal TFT T10-1 for receiving an output signal of the second lowering drive TFT T5-1, and lowering the output signal of the output terminal in conductive state thereof; a first off-drive TFT T6 for receiving the output signal of the first boosting drive TFT T1, and turning off the second lowering signal TFT T10 and the third lowering signal TFT T11 in conductive state thereof; a second off-drive TFT T6-1 for receiving the output signal of the first boosting drive TFT T1, and turning off the fourth lowering signal TFT T10-1 and the fifth lowering signal TFT T11-1 in conductive state thereof.

Figure 2A:
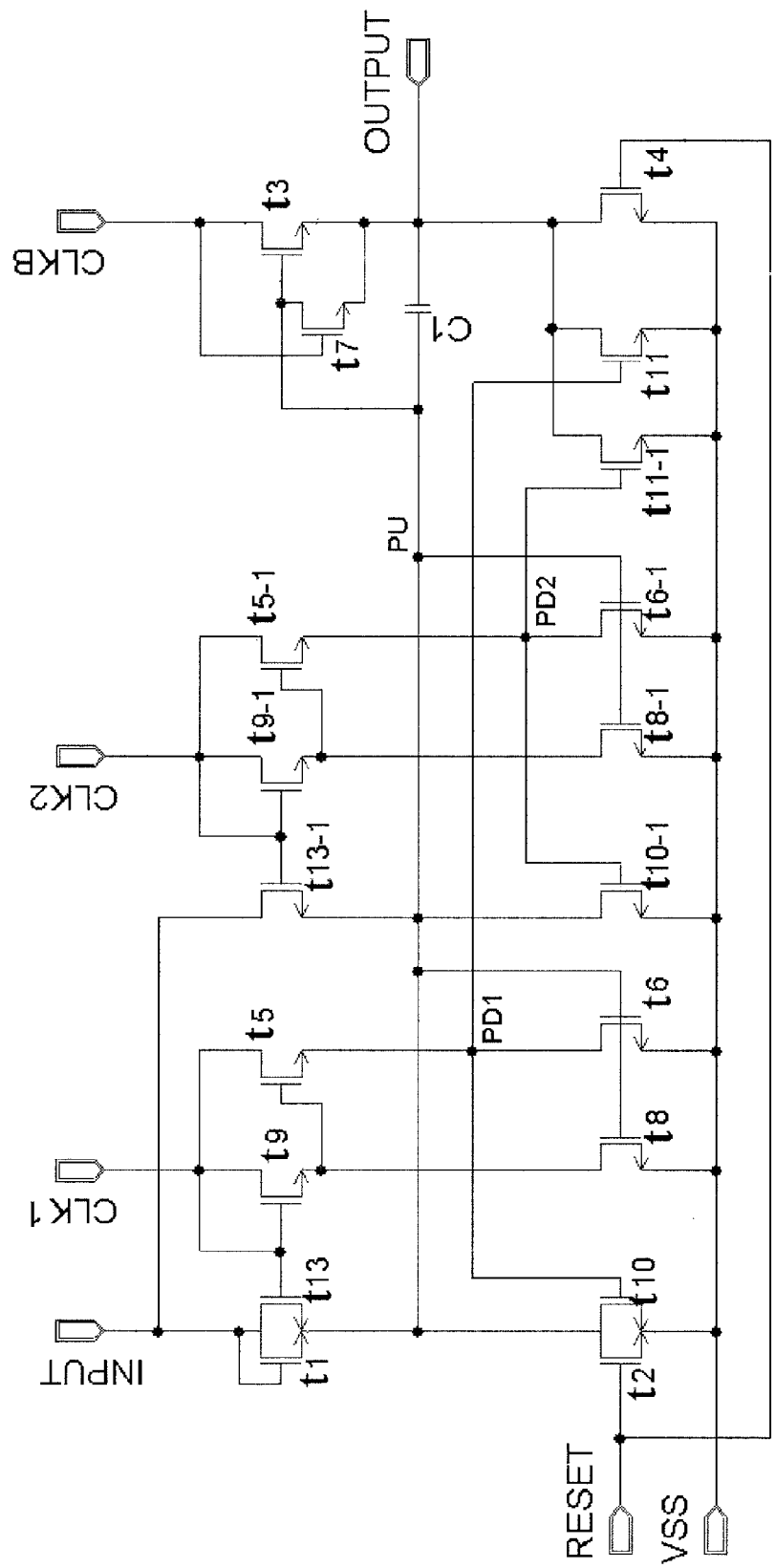
FIG. 2a shows a structure diagram for another shift register unit according to the invention.

As shown in FIG. 2a, in another shift register unit of the shift register according to the embodiment of the present invention, the boosting signal TFT t3, the first lowering drive TFT t5 and the second lowering drive TFT t5-1 respectively receive a fourth clock signal CLKB, a fifth clock signal CLK1 and a sixth clock signal CLK2.

The second clock signal and the third clock signal received by the shift register unit provided in the embodiment of the present invention are clock signals alternatively outputted every other frame.

The fifth clock signal and the sixth clock signal received by the shift register unit provided in the embodiment of the present invention are clock signals alternatively outputted every other frame.

It should be explained that, for the TFT employed in the field of the liquid crystal display, the drain and the source can be exchanged with each other. Therefore, the source of TFT mentioned in the embodiment of the present invention can be replaced with the drain of the TFT, and the drain of the TFT also can be replaced with the source of the TFT.

Hereinafter, the operation principle of the shift register units according to the embodiment of the present invention will be explained in connection with the FIGS. 1a and 1b.

Figure 1B:
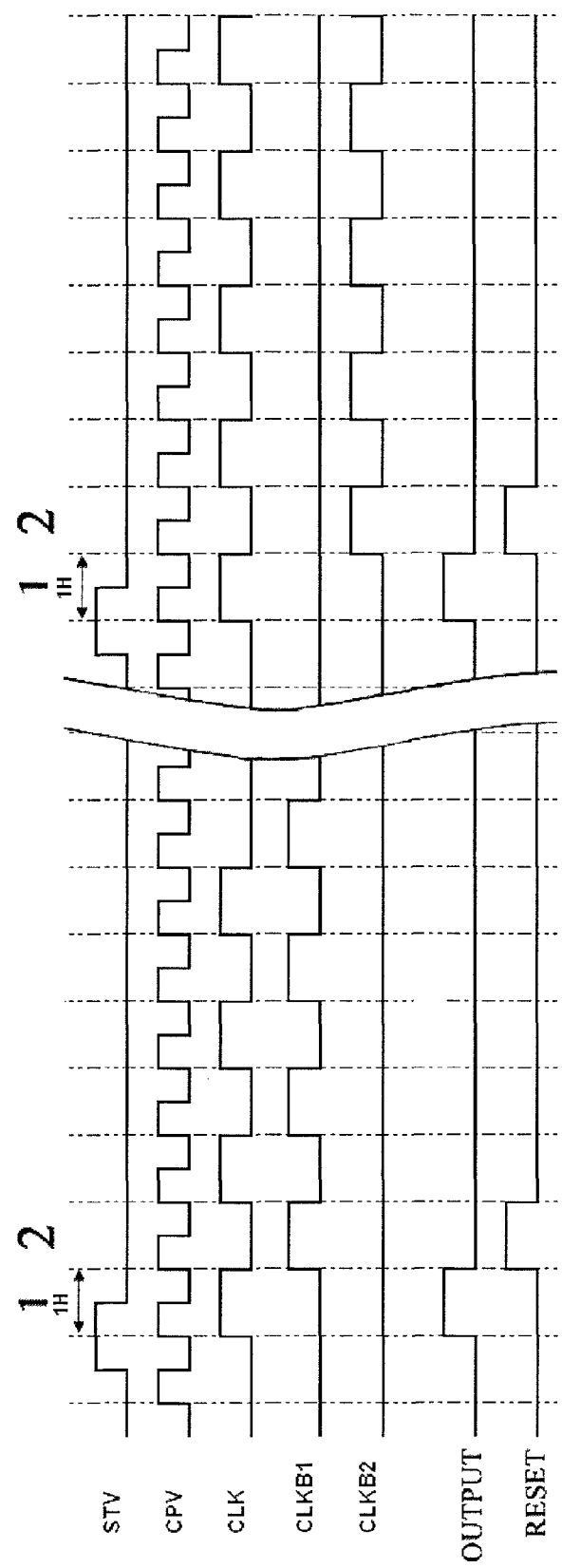

A part of the first frame of the timing chart shown in FIG. 1b is selected and a first two stages thereof are selected. At the first stage, an input signal (INPUT) is a frame start signal (STV), which is at the high level, and the first boosting drive TFT T1 is turned on and the voltage at PU node is boosted; the first off-drive TFT T6 and the second off-drive TFT T6-1 are turned on, so that the voltages at PD1 and PD2 nodes are at the low level, thus the second lowering signal TFT T10 and the third lowering signal TFT T11 are turned off; the auxiliary TFTs T8 and T8-1 are turned on, and the first lowering drive TFT T5 and the second lowering drive TFT T5-1 are discharged; the boosting signal TFT T3 is turned on, and the first clock signal CLK is at the high level at this timing, therefore the output signal (OUTPUT) of the signal output terminal (OUT) is at the high level, the input signal (RESET) of the reset signal input terminal (RESETIN) is at the low level, and the second boosting drive TFT T2 and the first lowering signal TFT T4 are turned off.

At the second stage, the input signal (INPUT) is at the low level, and the first boosting drive TFT T1 is turned off; the reset signal (RESET) is at the high level, the second boosting drive TFT T2, the first lowering signal TFT T4 are turned on, the PU node is discharged to become a the low level, and the output signal (OUTPUT) of the signal output terminal (OUT) becomes a the low level under effect of pulling down by the first lowering signal TFT T4; the second clock signal (CLKB1) is at the high level, the first lowering drive TFT T5 is turned on and the voltage at PD1 node is boosted, so that the second lowering signal TFT T10 and the third lowering signal TFT T11 are turned on, and the output signal (OUTPUT) of the signal output terminal (OUT) becomes a the low level under effect of pulling down by the second lowering signal TFT T10 and the third lowering signal TFT T11. Therefore, a duty cycle of the lowering drive TFT is lowered as compared with that of the existing lowering drive TFT, and a biasing effect of the TFTs for lowering drive can be effectively prevented. That is, the first lowering signal TFT T4, the second lowering signal TFT T10 and the third lowering signal TFT T11 are allowed to serve to suppress the noise, and the reliability of the shift register unit can be guaranteed.

A part of the second frame of the timing chart shown in FIG. 1b is selected and a first two stages thereof are selected. At the first stage, the input signal (INPUT) is a frame start signal (STV), which is at the high level, and the first boosting drive TFT T1 is turned on and the voltage at PU node is boosted; the first off-drive TFT T6 and the second off-drive TFT 16-1 are turned on, so that the voltages at PD1 and PD2 nodes are at the low level, thus the second lowering signal TFT T10 and the third lowering signal TFT T11 are turned off; the auxiliary TFTs T8 and T8-1 are turned on, and the first lowering drive TFT T5 and the second lowering drive TFT T5-1 are discharged; the boosting signal TFT T3 is turned on, and the first clock signal CLK is at the high level at this timing, therefore the output signal (OUTPUT) of the signal output terminal (OUT) is at the high level, the input signal (RESET) of the reset signal input terminal (RESETIN) is at the low level, and the second boosting drive TFT T2 and the first lowering signal TFT T4 are turned off.

At the second stage, the input signal (INPUT) is at the low level, and the first boosting drive TFT T1 is turned off; the reset signal (RESET) is at the high level, the second boosting drive TFT T2 and the first lowering signal TFT T4 are turned on, the PU node is discharged to the low level, and the output signal (OUTPUT) of the signal output terminal (OUT) becomes the low level under effect of pulling down by the first lowering signal TFT T4; the third clock signal (CLKB1) is at the high level, the second lowering drive TFT T5-1 is turned on and the voltage at PD2 node is boosted, so that the fourth lowering signal TFT T10-1, the fifth lowering signal TFT T11-1 are turned on, and the output signal (OUTPUT) of the signal output terminal (OUT) becomes the low level under effect of pulling down by the fourth lowering signal TFT T10-1 and the fifth lowering signal TFT T11-1. Therefore, a duty cycle of lowering drive TFT is lowered as compared with that of the existing lowering drive TFT, and a biasing effect of the TFTs for lowering drive can be effectively prevented. That is, the first lowering signal TFT T4, the fourth lowering signal TFT T10-1 and the fifth lowering signal TFT T11-1 are allowed to serve to suppress the noise, and the reliability of the shift register unit can be guaranteed.

In the process of operation of the above shift register, the first auxiliary TFT T8 and the second auxiliary TFT T8-1 respectively receive the output signal of the first boosting drive TFT T1, and in conductive state thereof discharge the first lowering drive TFT T5 and the second lowering drive TFT T5-1; the third auxiliary TFT T7, the fourth auxiliary TFT T9 and the fifth auxiliary TFT T9-1 respectively receive the first clock signal CLK1, the second clock signal CLKB1 and the third clock signal CLKB2, and in conductive state thereof reduce biasing effects of the boosting signal TFT T3, the first lowering drive TFT T5 and the second lowering drive TFT T5-1.

In the above shift register unit, two terminals of a capacitor C1 are respectively connected to the gate of the boosting signal TFT T3 and the signal output terminal (OUT). When the shift register unit is operated, the level of signal at the PU junction node can be boosted to a relatively high level due to coupling effect by the first capacitor C1.

Shown in FIG. 2a is a structure diagram for another shift register unit according to an embodiment of the present invention.

Figure 2B:
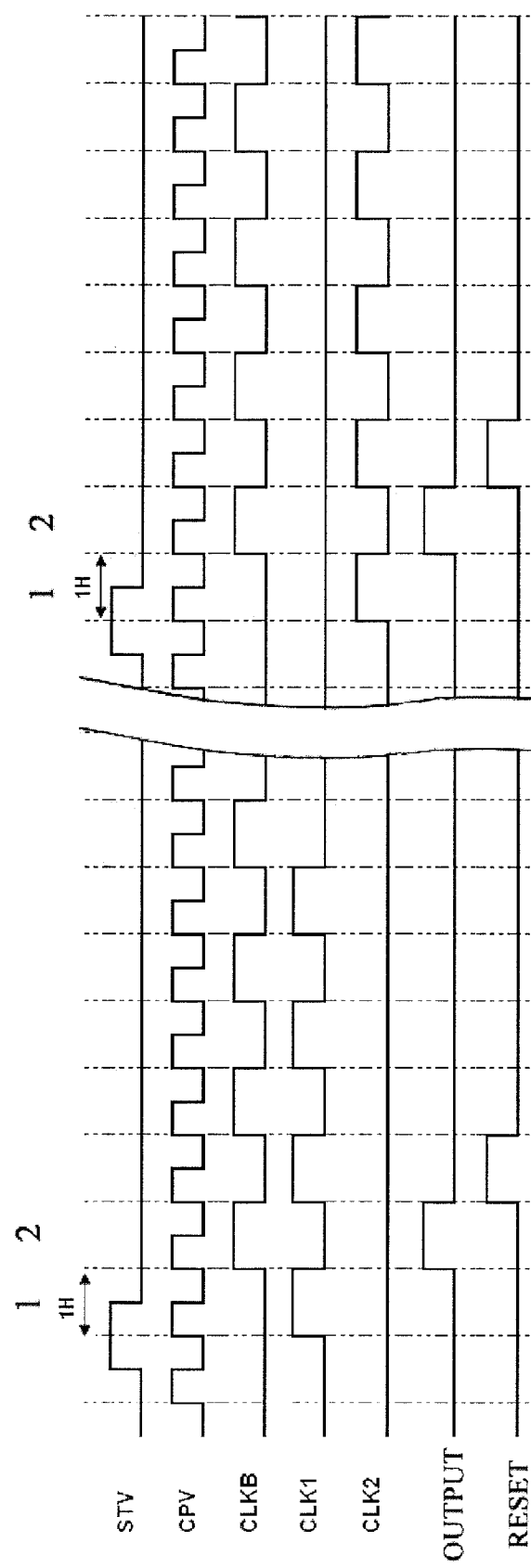

Shown in the FIG. 2b is a timing chart of input versus output of the other shift register unit shown in FIG. 2a.

The operation principles of the other shift register as shown in FIGS. 2a and 2b are similar to those of the above shift register, and description thereof will be no more repeated herein.

In other embodiments of the present invention, there are further provided a gate drive apparatus and a data line drive apparatus for a LCD comprising the above shift register (not shown). The gate drive apparatus and the data line drive apparatus can be arranged on the display panel of the LCD.

The shift register provided in the embodiments of the present invention can lower the duty cycle of the TFTs for lowering drive and effectively lower the bias effect by the TFTs for lowering drive, thereby the reliability of the shift register unit can be guaranteed.

Finally, it should be explained that, the above embodiments are only used to explain the technical solution of the present invention, and not for limitation thereto. Although the present invention has been explained in details with reference to the above embodiments, it should be understood by those skilled in the art that, the technical solution described in the above respective embodiments still can be modified, or part of the technical features thereof can be equivalently substituted, and these modifications or substitutions can not depart the essence of a corresponding technical solution from the spirit and scope of the technical solution according to the embodiments of present invention.

What is claimed is:

1. A shift register comprising at least two shift register units, one of which comprising:
    a boosting signal TFT for receiving a first clock signal, and outputting a high voltage signal to an output terminal in a conductive state thereof;
    a first boosting drive TFT for receiving a frame start signal or an output signal of another shift register unit so as to turn on the boosting signal TFT;
    a second boosting drive TFT for receiving a reset signal or an output signal of an other shift register so as to turn on the boosting signal TFT;
    a plurality of lowering signal TFTs including a first lowering signal TFT, a second lowering signal TFT, a third lowering signal TFT, a fourth lowering signal TFT, and a fifth lowering signal TFT.
    the first lowering signal TFT for receiving the reset signal or the output signal of the other shift register, and outputting a low voltage signal to the output terminal in conductive state thereof;
    a first lowering drive TFT for receiving a second clock signal so as to turn on the second lowering signal TFT and the third lowering signal TFT;
    a second lowering drive TFT for receiving a third clock signal so as to turn on the fourth lowering signal TFT and the fifth lowering signal TFT;
    the second lowering signal TFT for receiving the output signal of the first lowering drive TFT, and lowering the output signal of the output terminal in conductive state thereof;
    the third lowering signal TFT for receiving the output signal of the first lowering drive TFT, and in conductive state thereof lowering the output signal of the output terminal;
    a first off-drive TFT for receiving the output signal of the first boosting drive TFT, and in conductive state thereof turning off the second lowering signal TFT and the third lowering signal TFT;
    the fourth lowering signal TFT for receiving the output signal of the second lowering drive TFT, and in conductive state thereof lowering the output signal of the output terminal;
    the fifth lowering signal TFT for receiving the output signal of the second lowering drive TFT, and in conductive state thereof lowering the output signal of the output terminal; and
    a second off-drive TFT for receiving the output signal of the first boosting drive TFT, and in conductive state thereof turning off the fourth lowering signal TFT and the fifth lowering signal TFT, and
    in the other shift register unit adjacent to said shift register unit, a boosting signal TFT, a first lowering drive TFT and a second lowering drive TFT receiving a fourth clock signal, a fifth clock signal and a sixth clock signal respectively.

2. The shift register according to claim 1, wherein the shift register unit further includes a first auxiliary TFT and a second auxiliary TFT for respectively receiving the output signal of the first boosting drive TFT, and in conductive state thereof discharging the first lowering drive TFT and the second lowering drive TFT.

3. The shift register according to claim 1, wherein the shift register unit further includes a third auxiliary TFT, a fourth auxiliary TFT and a fifth auxiliary TFT for respectively receiving the first clock signal, the second clock signal and the third clock signal, and in conductive state thereof lowering bias effects of the boosting signal TFT, the first lowering drive TFT and the second lowering drive TFT.

4. The shift register according to claim 1, wherein the shift register unit further includes a capacitor, with two terminals being connected to the drain and the output terminal of the first boosting drive TFT respectively.

5. The shift register according to claim 1, wherein the second clock signal, the third clock signal received by the shift register unit are clock signals alternatively outputted every other frame.

6. The shift register according to claim 1, wherein the fifth clock signal and the sixth clock signal received by the shift register unit are clock signals alternatively outputted every other frame.

7. A gate drive apparatus for a liquid crystal display comprising the shift register according to claim 1.

8. A data line drive apparatus for a liquid crystal display comprising the shift register according to claim 1.

* * * * *

UNITED STATES PATENT AND TRADEMARK OFFICE
CERTIFICATE OF CORRECTION

| | | |
|---|---|---|
| PATENT NO. | : 8,736,537 B2 | Page 1 of 1 |
| APPLICATION NO. | : 13/380994 | |
| DATED | : May 27, 2014 | |
| INVENTOR(S) | : Seung Woo Han et al. | |

It is certified that error appears in the above-identified patent and that said Letters Patent is hereby corrected as shown below:

Title Page, Item (30)

Delete "Apr. 20, 2011" and insert --Apr. 23, 2010--

Signed and Sealed this
Fourteenth Day of April, 2015

Michelle K. Lee
*Director of the United States Patent and Trademark Office*